United States Patent [19]

Snoddy et al.

[11] Patent Number: 4,885,540
[45] Date of Patent: Dec. 5, 1989

[54] AUTOMATED NUCLEAR MAGNETIC RESONANCE ANALYSIS

[75] Inventors: Michael L. Snoddy; Houston B. Mount, II, both of Tulsa, Okla.

[73] Assignee: Amoco Corporation, Chicago, Ill.

[21] Appl. No.: 264,927

[22] Filed: Oct. 31, 1988

[51] Int. Cl.[4] .......................................... G01R 33/20
[52] U.S. Cl. ................................. 324/318; 324/303; 73/153
[58] Field of Search ............... 324/300, 303, 306, 318; 73/153, 152, 151

[56] References Cited

U.S. PATENT DOCUMENTS

| | | | |
|---|---|---|---|
| 3,373,440 | 3/1968 | Jenkins et al. | 346/107 |
| 3,414,725 | 12/1968 | Evans | 250/83.3 |
| 3,621,379 | 11/1971 | Watson et al. | 324/318 |
| 4,295,365 | 10/1981 | Meshri | 73/153 |
| 4,412,179 | 10/1983 | Brown | 324/303 |
| 4,531,093 | 7/1985 | Rollwitz et al. | 324/300 |
| 4,542,648 | 9/1985 | Vinegar et al. | 73/153 |
| 4,583,242 | 4/1986 | Vinegar et al. | 378/20 |
| 4,595,878 | 6/1986 | Bradshaw | 324/300 |

OTHER PUBLICATIONS

Brown et al., "Processing . . . Oil Determination", 1st Annual Logging Symposium, Jul. 1980.
Swayne, "Continuous . . . Exploration", Drill Bits, Spring, 1988.
Rothwell et al., "Petrophysical . . . Imaging", Applied Optics, Dec. 1985.
Loren, "Permeability . . . Measurements", J. of Petroleum Technology, Aug. 1972.
Timur, "Pulsed Nuclear Magnetic Resonance . . . Sandstone", J. of Petroleum Technology, Jun. 1969.

Primary Examiner—John Chapman
Assistant Examiner—Kevin D. O'Shea

[57] ABSTRACT

Porosity logs of continuous core are generated using nuclear magnetic resonance (NMR). Core containing naturally-occurring fluids is conveyed between poles of a magnet for NMR analysis. The NMR measures porosity and preferably oil and water saturation and even porosity distribution in the reservoir rock at intervals along the core. The core conveyor, the NMR, and data collection and display are controlled by a processor.

16 Claims, 3 Drawing Sheets

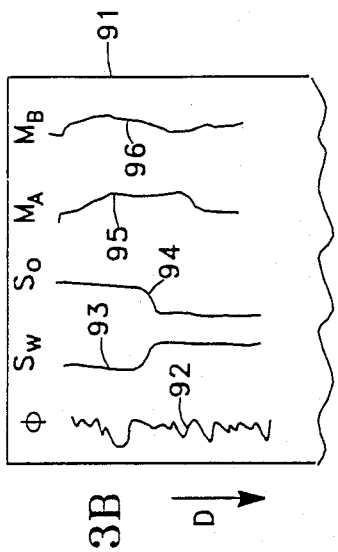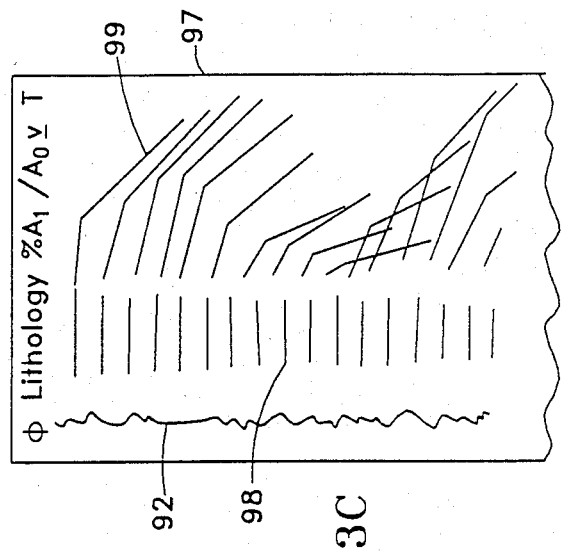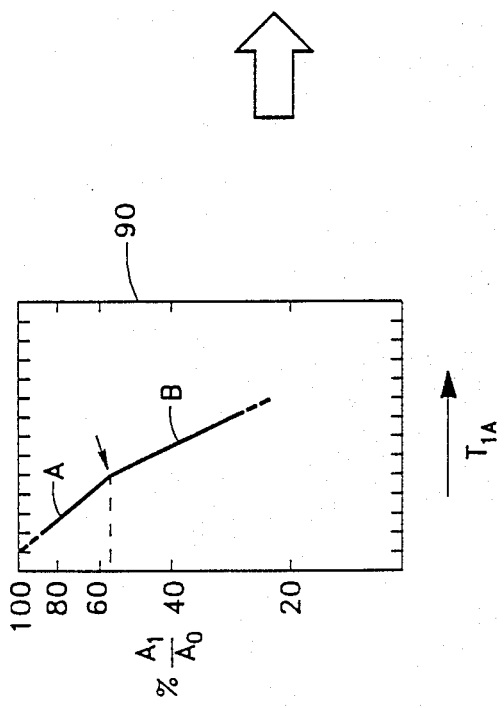

AUTOMATED NUCLEAR MAGNETIC RESONANCE ANALYSIS

FIELD OF THE INVENTION

The invention relates to analysis of cores removed from well boreholes. In a particular aspect, the invention relates to NMR (nuclear magnetic resonance) analysis of large quantities of full barrel core as such core is being produced at the wellsite. In another aspect, the invention relates to NMR analysis for determining porosity, hydrocarbon and water saturation of core containing in-situ fluids.

SETTING OF THE INVENTION

Wells can be drilled in which core is taken along substantially the entire depth of penetration from surface to total depth. See Swayne, "Continuous Wireline Core Drilling," *Drill Bits,* pgs. 7–12 (1988). However, heretofore there has not been available method and apparatus for making the benefits of field analysis of such core available to the explorationist since large quantities of core must be quickly analyzed. More particularly, there has not been available NMR method and apparatus for evaluating large quantities of such core in an efficient and timely way and generating indicators significant to the oil and gas explorationist as a function of depth in the subsurface.

NMR analysis has been conducted on core samples removed from wellbores to determine certain aspects of porosity. See Rothwell and Vinegar, "Petrophysical Applications of NMR Imaging," 24 Applied Optics, 3969–3972 (1985). However, such NMR analysis is generally or always of core at a time and place removed from the wellbore so that the core fluids are not present under in-situ conditions. In fact, NMR analysis of core is believed to have been generally on core which has been saturated with brines or other fluids or otherwise altered so that the resulting data are not representative of specifically subterranean fluids and conditions. Further, surface NMR systems are not believed heretofore to have been available for efficiently handling large quantities of core in a timely way and further not to have been used for producing an NMR record of core as a function of depth over significant intervals of cores, for example, in the range of 50 to 5000 ft or more. See Rothwell, et al., op. cit.; Meshri, U.S. Pat. No. 4,295,365 (1981); and Bradshaw, U.S. Pat. No. 4,595,878 (1986).

NMR logging has been conducted in the wellbore using the earth's magnetic field. See, e.g., Brown, et al., "Processing and Display of Nuclear Magnetism Logging Signals: Application to Residual Oil Determination," SPWLA 21st Annual Logging Symposium, July 8–11, 1980. However, since the, earth's magnetic field is weak, the resulting signals are noisy and difficult to interpret (low signal-to-noise ratio). Since the signal-to-noise ratio is low, productive zones characterized by moderate or low porosity values have been difficult to interpret. For example, noise occurring during logging could cause a zone erroneously to be interpreted as a high porosity zone; conversely, a lower porosity producible zone could be completely overlooked.

NMR analysis of core as it is being removed from the wellbore, still under substantially in-situ conditions of porosity and fluid content, prevents decompression and other changes in the core which occur after removal from the wellbore from significantly changing porosity characteristics and permits measurement of in-situ fluids under substantially in-situ conditions. Such data are of significant advantage to the explorationist and are believed heretofore not to have been available from core.

The invention in its various aspects provides the needed capabilities. The invention is not sensitive to shale and clay effects as is resistivity logging which produces data used in estimating porosity, produces a measure of porosity substantially representing macroporosity and not microporosity of a formation, does not require the use of a nuclear source, overcomes difficulties in using the earth's magnetic field as a magnetic source, provides a continuous log of porosity as a function of depth for reservoir rock, measures porosity under substantially in-situ conditions without removal of naturally present fluids, and does not require cutting of small discrete cores for NMR analysis. Those skilled in logging and reservoir analysis will recognize other advantages and benefits from the following description and the drawings.

SUMMARY OF THE INVENTION

The invention is a method for exploring for oil and gas by producing measures characteristic of core under substantially in-situ conditions using nuclear magnetic resonance (NMR). The invention comprises advancing increments of continuous core under substantially in-situ conditions to the magnetic and RF (radio frequency) pulse target zone (probe zone) of a nuclear magnetic resonance spectrometer and sequentially and successively measuring NMR response(s) of the core at each increment of the core.

The invention comprises method and apparatus for nuclear magnetic resonance (NMR) analysis of sections of core. NMR analysis means is provided for NMR analysis of a portion of core positioned in a probe zone thereof, the probe zone having an inlet side and an outlet side. Beltless drive means engages the drive engaging portion of a core trough comprising a receptacle portion for receiving a section of core and a drive engaging portion for engaging drive means. The drive means supports the core troughs and positions successive portions of a core supported in a core trough in the probe zone of the NMR analysis means and causes successive trough(s) supporting core sequentially to enter the inlet side of the probe zone of NMR means and after NMR analysis to exit the outlet side. Controller means causes the drive means to position successive portions of core supported in a core trough in the target zone and causes NMR analysis means to generate a measure of NMR response of such positioned successive portions of core and causes successive troughs supporting core to sequentially enter the inlet side of NMR analysis means and to exit the outlet side.

According to a further aspect of the invention, the beltless drive means comprises first drive means adjacent the inlet side and second drive means adjacent the exit side of the NMR analysis means, and the engaging portion of a core trough has a length effective for engaging both the first driver means and the second driver means.

According to another aspect, the invention further comprises sensing means for sensing a core trough along the path, the sensing means comprising a plurality of spaced-apart sensors for sensing a core trough at spaced-apart positions along the path, and for producing signals representative of position of a core trough along the path; and identifier means adjacent the path for responding to an identification on the core identifying the sections of core being carried by a core trough.

According to another aspect, the invention comprises a method for exploring for oil and gas by NMR analysis of core. Successive portions of core over an interval in the subsurface are positioned in the probe zone of NMR analysis means and measures of NMR response of such positioned successive portions of core are generated representative of each of oil and water saturation and from a display of such oil and water saturation as a function of depth, an indicator of the position of the water level in the subsurface is determined.

According to another aspect, the invention comprises a method for exploring for oil and gas. A measure of hydrogen-transient NMR (nuclear magnetic resonance) peak amplitude values $A_o$ at intervals spaced along core taken across a borehole interval is obtained and a display of $A_o$ as a function of depth along the borehole is generated. Then regions of high porosity as a function of depth in the subsurface are identified from the display.

According to further aspects, the invention comprises obtaining such core under conditions including time effective for maintaining naturally-occurring fluids in the core substantially as existing at the time of removal from the borehole, generating the display of $A_o$ based on the naturally-occurring fluids, and further generating measures of water saturation, oil saturation, and porosity distribution from the thus-provided core.

Figure 1:
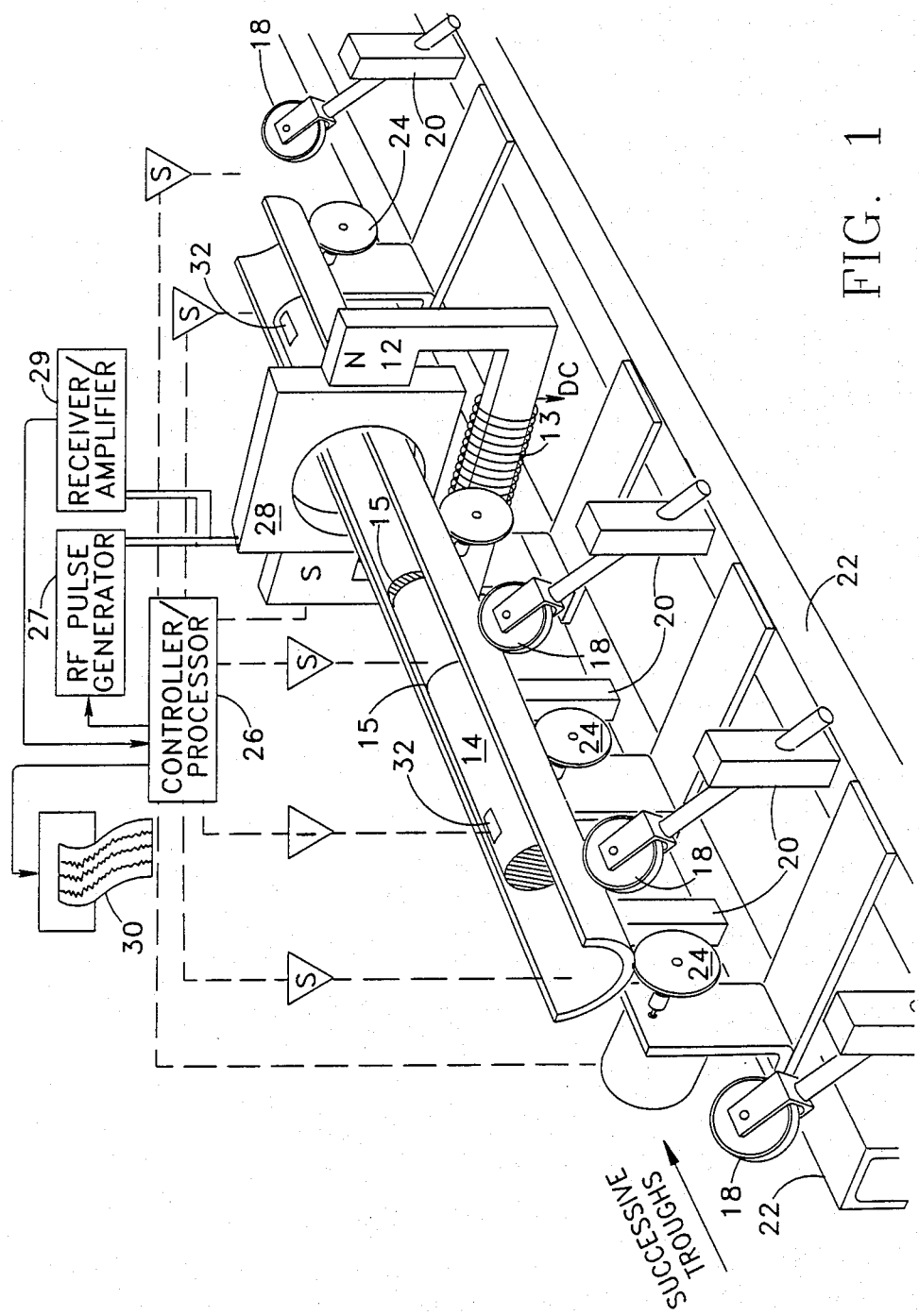
FIG. 1 illustrates in perspective view method and apparatus for NMR analysis of core.

and illustrates determination of $A_I$ and $T_{1A}$ values.

FIGS. 3A, 3B, and 3C illustrate how $T_{1A}$ varying as a function of the log value of $A_I/A_0$ can be used to evaluate changes in pore distribution and/or oil and water saturation in the subsurface.

FIG. 3A illustrates generally how the ratio $A_I/A_o$ varies as a function of $T_{1A}$ in reservoir rock having oil and water present.

FIG. 3B illustrates a display, as a function of depth of porosity $\phi$, oil and water saturation $S_w$ and $S_o$, and indicators of change in porosity distributions $M_A$ and $M_B$.

FIG. 3C illustrates a "waterfall" plot showing changes in oil and water saturation and changes in porosity distribution across intervals in the subsurface.

DETAILED DESCRIPTION OF THE INVENTION

The invention comprises a system for NMR analysis particularly useful for core taken during subterranean stratigraphic exploration. Subterranean stratigraphic exploration comprises taking large quantities of full barrel core during a drilling and coring operation so that most all of the subsurface is cored. Alternatively, sidewall cores can be taken after a well is drilled at intervals along the wellbore. However, the invention described herein achieves most advantageous results by processing full barrel core.

The system for NMR analyses of cores can comprise a core trough which has a receptacle portion for receiving a section of core and which has a drive engaging portion for being directly engaged by drive means which will drive the core trough through the probe zone (radio frequency coil) for NMR analysis. The core trough is preferably shallow and is preferably open above for receiving a section of core, which frequently is separated by breaks occurring during handling into several parts. The core trough is typically long and narrow. Preferably, the core trough has a length to width ratio of at least 2:1, preferably 5:1 or even 10:1 or more. The trough has a definite length selected for convenience of handling of the cores and troughs. Lengths of 1 to 6 ft are particularly convenient for handling by one person. The core trough can be constructed of plastics, fiberglass, or other nonmagnetic, preferably nonmetallic material, which are not characterized by detectable or significantly interfering nuclear magnetic resonance responses at the frequencies and under the conditions characteristic of detecting NMR responses of in-situ fluids of cores.

In a preferred embodiment, the core trough can be a shallow receptacle which provides sufficient lateral support of the core to prevent rotation of the core during movement through an analysis zone. The core trough can be, for example, U-shaped, V-shaped, and the like. Preferably, the core trough is U-shaped and has an inside diameter somewhat larger than the outside diameter of the sections of core being conveyed thereby. Such core troughs function to support sections of core during analysis. Broken sections of core can be placed in such troughs in their original orientation relative to one another. Since the section is supported against rotation by the trough during analysis, the results of analysis are representative of the core prior to breakage.

The drive engaging portion of the core trough can be any suitable mechanical arrangement for directly engaging and being engaged by a drive means and for being self-disengaging when the drive means has completed driving the core conveyor trough through the NMR analysis zone. The engaging portion can be a groove along the underside of the core trough, which receives and is engaged by drive means for imparting linear motion to the core trough. Many mechanical arrangements for drive engaging portions and drive means will be apparent to those skilled in the art. For example, the engaging portion of the trough can be the sides of the trough, and the drive means can have means for engaging the sides. The engaging portion of the core trough can be a portion of the core trough itself, and the drive means can be shaped so as to receive that portion of the core trough, for example, the drive means can comprise a wheel or gear having a concave surface which receives and engages the convex lower surface of the core trough. The drive engaging portion can be toothed and can mesh with toothed gears of the driving means or, alternatively, can be smooth and engaged by friction gears of the driving means. In all cases, in accordance with the invention, the engaging means and the drive means cooperate so that when a core trough engages a drive means, the drive means can impart linear motion to the core trough and so that the core trough and the drive means are self-disengaging when the drive means has driven the core trough a distance about equal to the length of the engaging portion of the core trough.

The invention also comprises drive means for directly engaging the engaging portion of the core trough and for imparting linear motion to the core trough, for driving the core trough along a path passing through the NMR RF coil for NMR analysis of core supported therein, and for self-disengaging from the core trough following such motion.

Preferably, the drive means is beltless and effective for driving the core trough along the path adjacent the analysis means without the drive means itself traveling along the path together with the trough. Such drive means can be provided by motors driving shafts which can directly engage the engaging portions of a core trough, shafts driving friction rollers or friction gears which directly engage the engaging portion of the core trough, and the like.

Since only the core trough and a section of core supported by the core trough passes through the RF coil probe, the RF coil can be shaped like the core and can surround and be closely adjacent the core and the power producing the magnetic field necessary for NMR analysis can be reduced, facilitating a more uniform flux density in the core being analyzed.

Path means which can be part of drive means is provided for supporting and guiding two or more successive core troughs as the core troughs are sequentially driven by drive means along the path onto the inlet side and out the outlet side of NMR means. The path means preferably terminates adjacent a first side of the RF coil and begins again adjacent the second side of the RF coil so that the coil and the adjacent magnets can be as small as possible.

The drive means is positioned adjacent the path for driving a core trough along the path. The drive means can include two or more drivers at spaced apart locations along the path. In this way, the length of the core trough can be reduced since the core trough must have a drive engaging portion effective for simultaneously engaging at least two of the spaced apart drive means. Two, three, four, or more drivers can be provided. Motors capable of precisely controlled motion are preferred, such as stepper motors.

The NMR analysis means can be a commercial unit adapted in accordance with the invention for field application or can be a unit designed specifically for field application. In the latter instance, an electromagnet is preferably used and is preferably designed to provide a uniform flux density within and closely adjacent the probe, the magnetic field falling off sharply away from the probe.

Sensing means can be provided adjacent the path for position sensing of core trough(s) along a path. Sensing means can comprise one, two, three, four, or more sensors at spaced apart locations along a path. Each sensor can provide a signal representative of the presence or absence of a core trough adjacent to the position of the sensor. The signals can be provided to a controller as described below. The sensor means can be, for example, photoelectric cells, microswitches mechanically actuated by passage of the core trough, and the like, suitable for indicating presence of a core trough at a location preferably adjacent the entrance to and/or exit from each analysis zone of a module. In this way, the position of a core trough at positions along the path of a module where control is important can be detected.

The sensing means provides one or more signals representative of position of a core trough to a controller for controlling drive means responsive to the signals. The controller can be, for example, a microprocessor, a computer, or the like, which receives the signals and then responds to the signals under direct operator control or under computer program control by controlling the drive means.

Identifier recognition means can also be provided adjacent the path means for each module for responding to an identifier, such as a bar code, or the like, placed adjacent each section of core. The identifier provides a signal representative of the section of core being analyzed in a module to the controller. The controller uses the identifier to identify the source of data, i.e., depth, being taken by the analyzer(s) at that module with the particular section of core being analyzed.

Referring now to the drawings in detail, FIG. 1 illustrates in perspective view a module in accordance with the invention for NMR analysis of core.

A path is defined for passing two or more successive core troughs supporting core through the NMR analysis zone by rollers 18, roller supports 20, and frames 22. A plurality of drive means 24 are provided, for example, stepper motors at spaced apart locations along the path for driving the trough along the path. Each drive means is controlled by controller/processor 26 which receives position signals representative of core trough(s) positions by a plurality of spaced apart sensors S. An identifier sensor I also provides a signal to the controlled process by responding for example to a bar code or other identifier 30 placed on the section of core by the handler as the identifier 30 passes thereby.

Under control of controller processor 26, core 14 is advanced by motors 24, preferably in discrete increments of motion, so that successive intervals of cores supported by successive core troughs are positioned within RF probe 28 and between the poles of electromagnet 12. The hydrogen nuclei of the positioned portions of the cores in the probe within the magnetic field are aligned parallel to the magnetic field. Then RF pulse generator 27 under control of controller 26 generates a 90° pulse, i.e., a pulse having sufficient power, frequency, and duration to reorient the hydrogen nuclei in the core fluid 90° from the magnetic field. Under control of controller 26, the time between pulses is varied and repeated, until the voltage induced in coil 28 after each pulse and detected by receiver amplifier 29 reaches a maximum. This maximum value $A_o$ is the hydrogen transient NMR signal peak amplitude value and is indicative of total hydrogen concentration of macroporosity of the core within the target zone. Methods for evaluation of $A_o$ are well known to those skilled in NMR analysis and need not be further discussed here.

Various measures in accordance with the invention can be displayed as a function of depth on a monitor or by chart recorder 30, all such methods of display being chart means herein.

The hydrogen transient peak amplitude value $A_o$ is proportional to water and hydrocarbons present in macropores of the core and is therefore directly proportional to the macroporosity $\phi$ of the core in the target zone. Calibrating the instrument, i.e., receiver amplifier 29 to core samples having known porosities, the peak amplitude values can be made to correspond to actual porosity values.

The increment of core undergoing analysis has a depth associated with it which the processor 26 updates as the core is advanced using position sensors S and information concerning the drive distance of motors 24 which are also controlled by controller 26. Preferably, the initial depth of each section of core is input to processor 26, for example, by bar code reader I which reads bar code data 32 representative of depth as the core approaches NMR analysis. Thus, the system can be completely automated for NMR analysis of core responsive to a core being advanced into the system.

For each increment in advance of the core, preferably there is also produced a measure of oil and water saturation of the core. This can be done by using the relationship $$A = A_o e^{-\tau/T_1}$$

to estimate values of $T_1$ where $A_o$ is the maximum amplitude hydrogen transient, A is the amplitude induced in the coil, $\tau$ is a delay time between two 90° pulses as discussed below, and $T_1$ is spin-lattice relaxation time. Under control of controller 26, pulse generator 27 generates a series of pulse sequences of the form $90° - \tau - 90°$ where $\tau$ (tau) is a variable time period of increasing length through the series. The induced NMR signal amplitude after the second 90° pulse at each sequence is recorded.

Figure 2:
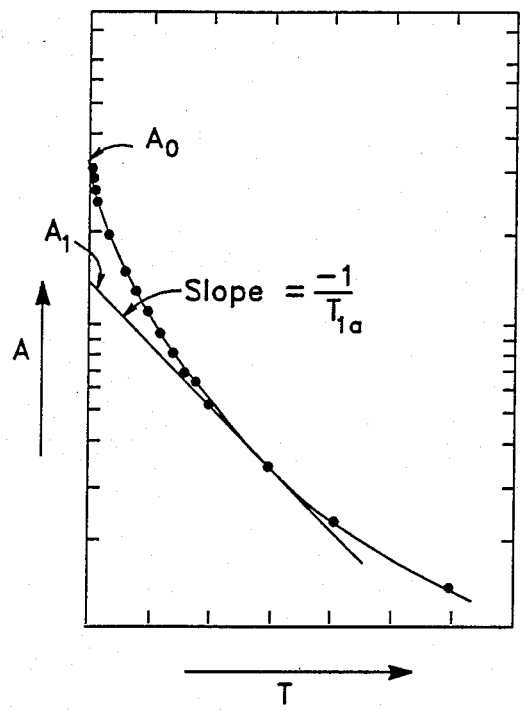
FIG. 2 illustrates how hydrogen transient amplitude values vary as a function of time $\tau$ according to the relation $$A = A_0 e^{-\tau/T_1}$$

Referring now to FIGS. 2 and 3, FIGS. 2 and 3 illustrate a method for generating measures indicative of water and oil saturation and of porosity distribution in the subsurface.

Referring now to FIG. 2, FIG. 2 illustrates how hydrogen-transient amplitude values A vary as a function of time $\tau$ and illustrates determination of $A_1$ and $T_{1A}$ values. FIG. 2 can be generated by recording amplitude values A on a log axis for a plurality of delay times $\tau$ plotted on a linear axis. As illustrated, the amplitude A decreases as the time delay $\tau$ increases. Any two $\tau$, or any two selected points along the curve, defines a curve segment. One such curve segment is illustrated having a tangent drawn thereto intersecting the amplitude axis. The slope of the tangent is $-1/T_{1A}$ where $T_{1A}$ is the apparent or measured spin lattice relaxation time for the segment. If the line tangent to and having the slope of the segment is extended back to $\tau=0$, then the corresponding amplitude $A_I$ can be determined as illustrated. $A_o$ is also illustrated on FIG. 2. $A_o$ provides a measure of porosity $\phi$ which can be plotted by chart recorder 30 (see FIG. 1) to produce a display of porosity as a function of depth (see curve 92 on display 91 of FIG. 3B).

From values of $A_o$, $A_I$, and $T_{1A}$, plot 90 illustrated schematically in FIG. 3A can be obtained.

In cores the initial part of such a plot represents hydrogen nuclei of water and the latter part of such a curve represents hydrogen nuclei of oil if present. Thus plot 90 displays the water component of pores in the rock in the lower values of $T_{1A}$. It is theorized that water is represented in the lower values of $T_{1A}$ due to water being present at the rock matrix surface of pores, leading to shorter relaxation time values, whereas oil is present in the center of the pores. This theory does not limit the invention. Generally, oil if present will have higher $T_{1A}$ values; however, where the API gravity of oil is high, the relaxation time for such oil can be similar to that of water at the matrix surface, a fact which can be taken into consideration in interpreting displays produced in accordance with the invention.

Thus, FIG. 3A illustrates generally how the ratio $A_I/A_o$ varies as a function of $T_{1A}$ in reservoir rock having oil and water present. It will be seen that the curve can have a portion A and a portion B of differing slopes and a break point or region indicated by the arrow on the Figure between portions A and B.

The location of the break point in a reservoir rock having oil and water present is indicative of percent water saturation $S_w$ as illustrated by the dashed line intersecting the $A_I/A_o$ axis. Oil saturation $S_o$ can be estimated by $S_o = 100 - S_w$. Both values can be used as qualitative indicators of oil and water saturation or if desired can be calibrated against standards to provide more quantitative estimates.

As water and oil saturation changes in a particular reservoir rock, the location of the breakpoint will correspondingly vary. Hence, by plotting the breakpoint as a function of depth an indicator of oil and water saturation is generated. Alternatively, two indicators 93 and 94 can be generated for $S_w$ and $S_o$ as described above (see display 91 of FIG. 3B).

Plot 90 in FIG. 3A can also provide information about porosity distribution in reservoir rock.

As used herein, the term porosity refers as is well known to the fraction or percentage of pore volume in a volume of rock. The porosity of a rock results from the pores in the rock which may be more or less uniform in size or may have several populations of sizes, or may vary in more or less continuous fashion from one size to another. The relative abundance of pores of varying size is referred to as pore size distribution or porosity distribution.

In the case where a rock contains little or no oil, plot 90 of FIG. 3A will provide a display of pore size distribution, smaller pores having lower $T_{1A}$ values and larger pores having higher $T_{1A}$ values. Rock quality is a measure of the extent to which larger pores are present. A rock with a high proportion of larger pores is said to have a higher rock quality than a rock with a high proportion of smaller pores.

Thus, where rocks of a single type, for example, a single lithology, are NMR analyzed in accordance with the invention, the displays in accordance with the invention can provide an indicator of change in rock quality as a function of depth in the subsurface. Generally speaking, plots 90 having steeper slopes will be poorer in rock quality and plots 90 having shallower slopes will have better rock quality. This aspect of the invention can be more advantageously used if descriptions of lithology 98 (see display 97 in FIG. 3C) are displayed adjacent a display 99 of plots 90 as a function of depth. Since the core is present during analysis, such lithology descriptions can be readily prepared by those skilled in the art and provided as input to processor 26. By plotting display 98 of lithology adjacent a display 99 of plots 90 as a function of depth, those skilled in the art will be aided in determining whether a change with depth of plots 90 is indicative of a change in rock quality, or lithology, as well as changes in oil and water saturation.

As indicated, as pore distribution of a reservoir rock changes the slopes of the A and B portions of plot 90 will be altered. Hence, it may also be desirable to plot the slopes 95 and 96 of the A and B portions of plot 90 ($M_A$ and $M_B$, respectively) as an indicator of change in porosity distribution and therefore of change in the reservoir rock being evaluated. See display 91 on FIG. 3B. This can be done by locating the breakpoint or region and then selecting slope values relative to the breakpoint for display as a function of depth along the borehole.

As suggested, it may also be desirable to display "waterfall plots" 99 of the function 90 such as illustrated in FIG. 3C as a function of depth. See display 97 on FIG. 3C. In this event, the plot 90 produced for each depth is plotted for each depth. These displays can be inspected by determining changes in curve shape and location of breakpoints to provide significant information to the oil and gas explorationist concerning changes in oil and water saturation and changes in porosity distribution of reservoir rock across intervals in the subsurface. Such a waterfall plot 99 is schematically illustrated in FIG. 3.

In accordance with the invention, controller processor 26 advances trough(s) supporting core(s) by motors 24 by increments, for example, 4 or 6 in. or more per advance. For each increment advance, the controller 26 causes RF pulse generator 27 to determine the maximum amplitude hydrogen transient signal $A_o$ and preferably also causes a series of pulse sequences $90°-\tau-90°$ over a range of delays $\tau$ to be generated. At least two or more values of $\tau$ are used, preferably five to ten or more to permit evaluation of $S_w$, $S_o$, and slopes or rates of change or curves as, described above in connection with FIGS. 3A, 3B, and 3C. Data received by receiver amplifier 29 are digitized and provided to processor 26. Processor 26 for each depth increment generates a porosity value, for example, $A_o$ and a water saturation value, $S_w$, and an oil saturation value, $S_o$, for example, as determined below. Further, the slope $M_A$ of the water relaxation portion A of the curve in FIGS. 3A, 3B, and 3C and the slope $M_B$ of the oil saturation portion B of the curve in FIGS. 3A, 3B and 3C, respectively can also be determined. Then for each depth increment, processor 26 can cause printers 30 to display a log of measures indicative one or more of porosity $\phi$ or $A_o$, water saturation $S_w$, oil saturation $S_o$, the slopes $M_A$ and $M_B$ of the water and oil relaxation portions of a function as illustrated in FIGS. 3A, 3B and 3C, or even a waterfall display of plots 90 as a function of depth. Other NMR measurements such as $T_2$ (spin-spin relaxation time) can also be measured by those skilled in the use of NMR systems to further aid in discriminating oil and water. Other interpretive values such as those representative of permeability can also be generated and displayed.

It will be appreciated that processor 26 can be readily programmed to carry out the foregoing procedures by one skilled in the art. For example, in regard to selecting measures representative of oil and water saturation, processor 26 can be programmed to generate plots or functions 90 of FIGS. 3A, 3B and 3C and to determine whether or not a break point (change in slope) occurs on the plot by evaluating the corresponding data, and where a break point occurs, the values of % $A_1/A_o$ can be made with respect to the break point to determine suitable measures of oil and water saturation. Further, the slopes of portions of the plot on each side of the break point or region can be selected and displayed. It will be appreciated that the various values can also be calibrated against known standards so that a more quantitative result is produced.

In many instances, a qualitative measure of oil and water saturation values will provide needed information to the explorationist. One example is the determination of the water level along the wellbore. By processing fresh core still substantially saturated with in-situ fluid using the invented apparatus and method, where the degree of water saturation increases and concurrently the oil saturation decreases, the depth of such change is indicative of the location of the water level in the subsurface. Such information can be used in determining where casing is to be perforated for production since the goal is to maximize production of hydrocarbons and to minimize production of water.

It is appreciated that the invention has provided method and apparatus for NMR analysis of core which takes advantage of the fluids in the core whereas other methods of porosity determination require removal of the core fluids. Further, the invention will not see shale or clay effects which causes many downhole logging tools used to measure porosity to report erroneous porosity values; in fact, this continuous NMR porosity determination of full barrel core may possibly eliminate the need for downhole porosity logs.

The NMR in accordance with the invention will also not see microporosity that also causes some downhole logging tools to report erroneous porosity values. This is because fluids in microspores and in most solids such as used in the troughs to transport the core in accordance with the invention have a spin—spin relaxation time $T_2$ so short that the NMR response will not interfere with signals characteristic of liquids generally or of liquids in the macrospores.

Further, NMR does not present health hazards that might be encountered in the use of a nuclear source for porosity determination. Further, NMR analysis in accordance with the invention is rapid and automated, thus allowing the analysis of large quantities of continuous core in realtime at the wellsite while the in-situ fluids are still substantially intact.

What is claimed is:

1. Apparatus for oil and gas exploration by nuclear magnetic resonance (NMR) analyses of sections of core comprising:

NMR analysis means for NMR analysis of a portion of core positioned in a probe zone thereof, the NMR means having an inlet side and an outlet side;

beltless drive means for engaging the drive engaging portion of a core trough comprising a receptacle portion for receiving a section of core and a drive engaging portion for engaging drive means and for supporting the core trough and for positioning portions of a core supported in the core trough in the target zone of NMR analysis means and for causing successive troughs supporting core sequentially to enter the inlet side of NMR means and after NMR analysis to exit the outlet side; and controller means for causing the drive means to position successive portions of supported core in the target zone and for causing NMR analysis means to generate a measure of NMR response of such positioned successive portions of core and for causing successive troughs supporting core to sequentially enter the inlet side of NMR analysis means and to exit the outlet side.

2. The apparatus of claim 1 further comprising two or more core troughs supported by the drive means.

3. The Apparatus of claim 1 wherein:

the measure of NMR response is indicative of porosity of thus positioned successive portions of core; and wherein the controller means further causes the NMR analysis means to generate a measure of at least one of water saturation and hydrocarbon saturation.

4. The Apparatus of claim 2 further comprising chart means for generating a display of measures of porosity and at least one of water saturation and hydrocarbon saturation as a function of position along a core.

5. The Apparatus of claim 2 further comprising:
chart means for generating a display of measures of porosity distribution in the subsurface.

6. The Apparatus of claim 2
wherein the drive means comprises a motor for imparting rotary motion to a shaft, and
wherein the shaft engages the drive engaging portion of the core trough.

7. The Apparatus of claim 1
wherein the beltless drive means comprises first drive means adjacent the inlet side and second drive means adjacent the exit side of the NMR analysis means, and
wherein the engaging portion of the core trough has a length effective for engaging both the first driver means and the second driver means.

8. The Apparatus of claim 1
wherein the drive means comprises a plurality of spaced apart drivers along the path, and
wherein the engaging portion of a core trough has a length effective for simultaneously engaging at least two of the spaced apart drivers.

9. The apparatus of claim 1 further comprising:
sensing means for sensing position of a core trough along the path.

10. The apparatus of claim 1 further comprising:
sensing means for sensing a core trough along the path, the sensing mean comprising a plurality of spaced-part sensors for sensing a core trough at spaced apart positions along the path, and for producing signals representative of position of a core trough along the path.

11. The apparatus of claim 1 further comprising:
sensing means for sensing a core trough along the path, the sensing means comprising a plurality of spaced apart sensors for sensing a core trough at spaced apart positions along the path and for producing signals representative of position of position of a core trough along the path; and
control means for controlling drive means responsive to the signals.

12. The apparatus of claim 1 further comprising:
identifier means adjacent the path for responding to an identification on the core identifying the sections of core being carried by a core trough.

13. Method for NMR analysis of core comprising:
positioning successive sections of core taken over an interval along a wellbore in the subsurface in the probe zone of an NMR analysis means;
the core still substantially saturated with in-situ along-the-wellbore fluids;
generating a measure of NMR response of such positioned successive sections of core representative of each of oil water saturation;
generating a display of such oil and water saturation as a function of depth; and
determining from the display a depth at which water saturation increases and oil saturation decreases as an indicator of the position of the water level in the subsurface.

14. Method for exploring for oil and gas comprising:
obtaining core taken across an interval of a borehole;
generating a measure of hydrogen transient NMR (nuclear magnetic resonance) peak amplitude values $A_o$ at intervals spaced along the core taken across the borehole interval;
generating a display of $A_o$ as a function of depth along the borehole; and
identifying variations in porosity as a function of depth in the subsurface from the thus generated display.

15. The method of claim 14 further comprising:
generating the measure of such core under conditions including time effective for maintaining naturally occurring fluids substantially as existing in the core at the time of removal from the borehole;
generating the display of $A_o$ based on the naturally occurring fluids; and
further generating measures of water saturation and oil saturation from the thus provided 16. The Method of claim 14 further comprising:
generating a display representative of the change in porosity distribution of reservoir rock as a function of depth.

* * * * *

UNITED STATES PATENT AND TRADEMARK OFFICE
CERTIFICATE OF CORRECTION

PATENT NO. : 4,835,540

DATED : December 5, 1989

INVENTOR(S) : Michael L. Snoddy et al

It is certified that error appears in the above-identified patent and that said Letters Patent is hereby corrected as shown below:

Column 12, line 38, "thus provided" should read --thus provided core.--.

Signed and Sealed this

Fourth Day of December, 1990

Attest:

HARRY F. MANBECK, JR.

*Attesting Officer*     *Commissioner of Patents and Trademarks*